United States Patent
Naito et al.

(10) Patent No.: US 10,722,976 B2
(45) Date of Patent: Jul. 28, 2020

(54) LASER WELDED JOINT AND LASER WELDING METHOD

(71) Applicant: NIPPON STEEL & SUMITOMO METAL CORPORATION, Tokyo (JP)

(72) Inventors: Yasuaki Naito, Tokyo (JP); Yasunobu Miyazaki, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 119 days.

(21) Appl. No.: 15/512,175

(22) PCT Filed: Sep. 17, 2015

(86) PCT No.: PCT/JP2015/076528
§ 371 (c)(1),
(2) Date: Mar. 17, 2017

(87) PCT Pub. No.: WO2016/043278
PCT Pub. Date: Mar. 24, 2016

(65) Prior Publication Data
US 2017/0274473 A1    Sep. 28, 2017

(30) Foreign Application Priority Data
Sep. 19, 2014    (JP) .................... 2014-191806

(51) Int. Cl.
*B23K 26/00* (2014.01)
*B23K 26/02* (2014.01)
(Continued)

(52) U.S. Cl.
CPC .......... *B23K 26/067* (2013.01); *B23K 26/035* (2015.10); *B23K 26/0676* (2013.01);
(Continued)

(58) Field of Classification Search
CPC ............ B23K 2101/18; B23K 2103/04; B23K 26/035; B23K 26/067; B23K 26/0676;
(Continued)

(56) References Cited

U.S. PATENT DOCUMENTS

| 2013/0168371 A1 | 7/2013 | Furusako et al. | |
| 2015/0352666 A1* | 12/2015 | Fujita | B23K 26/14 |
| | | | 219/121.61 |

FOREIGN PATENT DOCUMENTS

| CN | 101676060 A | 3/2010 |
| CN | 103769746 A | 5/2014 |

(Continued)

OTHER PUBLICATIONS

International Search Report for PCT/JP2015/076528 dated Dec. 15, 2015.

(Continued)

*Primary Examiner* — Sang Y Paik
(74) *Attorney, Agent, or Firm* — Birch, Stewart, Kolasch & Birch, LLP

(57) ABSTRACT

A laser welded joint excellent in joint strength preventing a bead from cracking and comprised of exactly the number of weld beads required for joint strength in overlay laser welding of steel sheets forming multiple ring-shaped weld beads, produced by a step of overlaying a plurality of metal sheets and forming a first weld bead and a step of firing a laser beam to successively form a further two or more weld beads at the outside of the first weld bead by laser irradiation, the surface hardness of the weld bead increasing from the inside bead to the outside bead.

16 Claims, 4 Drawing Sheets

(51) Int. Cl.
*B23K 26/067* (2006.01)
*B23K 26/244* (2014.01)
*B23K 26/035* (2014.01)
*H01L 21/67* (2006.01)
*H01S 3/00* (2006.01)
*H01S 3/131* (2006.01)
*B23K 101/18* (2006.01)
*B23K 103/04* (2006.01)

(52) U.S. Cl.
CPC ...... *B23K 26/244* (2015.10); *H01L 21/67144* (2013.01); *H01S 3/0014* (2013.01); *H01S 3/131* (2013.01); *B23K 2101/18* (2018.08); *B23K 2103/04* (2018.08)

(58) Field of Classification Search
CPC ............ B23K 26/244; H01L 21/67144; H01S 3/0014; H01S 3/131
USPC ......................................... 219/121.6–121.86
See application file for complete search history.

(56) References Cited

FOREIGN PATENT DOCUMENTS

| | | |
|---|---|---|
| JP | 2012-115876 A | 6/2012 |
| JP | 2012-240086 A | 12/2012 |
| JP | 2014-4619 A | 1/2014 |
| WO | WO 2012/050097 A1 | 4/2012 |

OTHER PUBLICATIONS

Written Opinion of the International Searching Authority for PCT/JP2015/076528 (PCT/ISA/237) dated Dec. 15, 2015.
Japanese Notification of Reasons for Refusal for counterpart Japanese Application No. 2016-548948, dated Apr. 9, 2019, with English translation.

* cited by examiner

FIG. 1
(a)
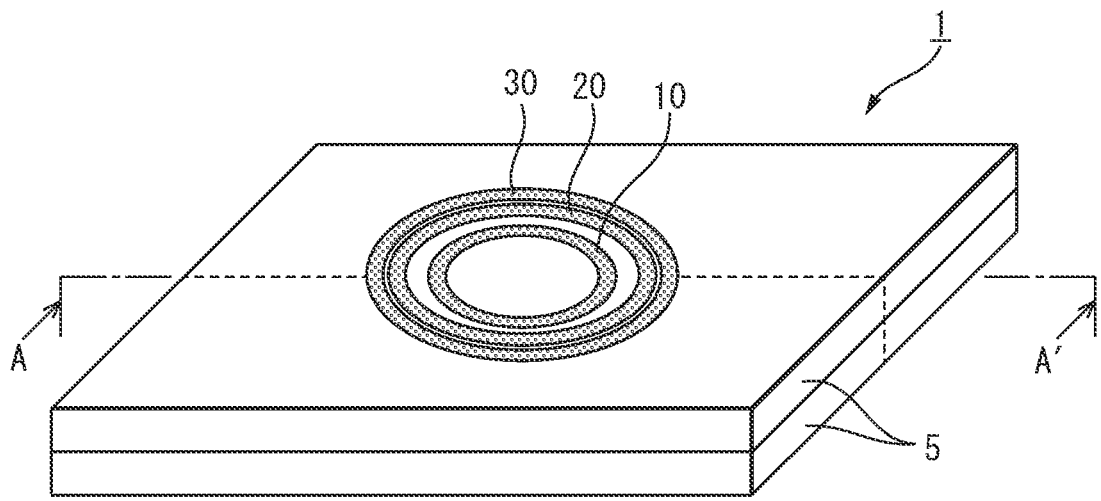
(b)
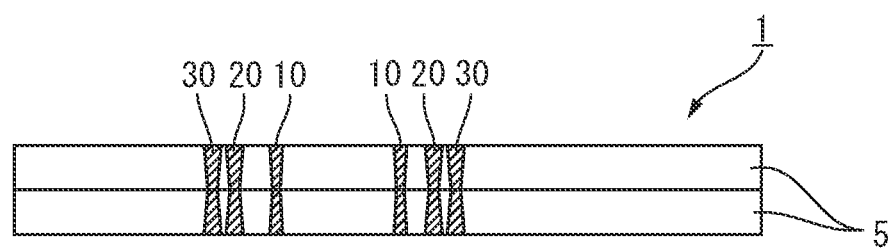

LASER WELDED JOINT AND LASER WELDING METHOD

TECHNICAL FIELD

The present invention relates to a welded joint obtained by overlaying a plurality of metal sheets and spot welding them by a laser, more particularly relates to a laser welded joint given multiple weld beads, improved in quality, and excellent in joint strength and to a laser welding method for the same.

BACKGROUND ART

For example, in recent years, to respond to the demands for improvement of the fuel efficiency of automobiles and enhancement of safety or the like, high strength thin-gauge steel sheets have been used in large amounts in automobile body. Use of laser welding to weld these steel sheets at a faster speed has been sought. Furthermore, when overlaying and laser welding high strength thin-gauge steel sheets, it is preferable that a high strength of the joints can be stably obtained.

Laser welding uses laser beam as a heat source, so enables more reliable and easier control of the heat input compared with arc welding such as TIG welding and MIG welding. For this reason, by suitably setting the welding speed, the irradiation power of the laser beam, the flow rate of the shielding gas, and other welding conditions, the welding deformation can be reduced. Further, laser welding enables welding from one side, so is preferable for welding for assembling complicated members such as the body of automobiles In recent years, high efficiency remote laser welding using a mirror for positioning a laser beam at a high speed and moving it between weld locations in a short time has been spreading.

In remote laser welding, for example, as shown in FIG. 5, a plurality of weld points of the flange part 50a of a hat-shaped member 50 are laser welded with weld beads 51.

In laser welding, if a load is applied to the weld zone, stress concentrates near the portion where the fusion line of the weld bead (weld interface) and the overlaid part of the steel sheets intersect. For this reason, depending on the magnitude of the load, sometimes this leads to fracture.

PLT 1 discloses a method of dealing with this problem by, as shown in FIG. 4, further forming a second weld bead 61 at the inside of a first weld bead 60 to make the weld bead multiple beads and thereby further improve the joint strength of the steel sheets 5, 5 and tempering the first bead 60 by the heat of the second bead 61. Due to this, the ductility of the weld interface of the weld bead is improved, the concentration of stress at the overlaid part at the time of application of load is eased, and the tolerance to the applied load becomes higher.

PLT 2 discloses the method of forming three beads in the order of the main bead, compression field providing bead, and tempered bead and preventing cracking of the beads.

CITATION LIST

Patent Literature

PLT 1: International Publication No. WO2012/050097A
PLT 2: Japanese Patent Publication No. 2012-240086A

SUMMARY OF INVENTION

Technical Problem

When like in PLT 1 forming multiple ring-shaped weld beads to laser weld steel sheets, when forming the second weld bead inside the first weld bead, sometimes a longitudinal crack forms at the inside weld crack depending on the material of the steel sheets welded or the size of the weld bead.

If a load is applied to a weld in which a crack has occurred, the value of the stress generated near the portion where the fusion line of the bead and the overlaid surfaces of the steel sheets intersect becomes higher compared with when no crack has occurred. As a result, it becomes difficult to secure strength against shear load parallel to the overlaid surfaces of the steel sheets and strength against the load in the peeling direction.

In PLT 2, when the joint strength is not sufficient with a 3-circular beads, a 3+2n ("n" is an integer of 0 or more) number of beads are formed like with a 5-circular beads or 7-circular beads so as to form more than the number of beads required for securing the joint strength.

At this time, when welding a location with a limited area such as a flange, the distance between the beads is predetermined, so once formed beads are again welded. As a result, due to spatter, the thickness of the weld metal in the sheet thickness direction is reduced. Further, due to the excessive heat input, there are the defects that the heat affected zone is softened and the joint strength falls.

The present invention, in consideration of the above situation, has as its object to provide a laser welded joint excellent in joint strength preventing a bead from cracking and comprised of exactly the number of weld beads required for joint strength and a laser welding method for the same in overlay laser welding of steel sheets forming multiple ring-shaped weld beads.

Solution to Problem

The inventors studied the causes for cracks of an inside bead as described above in laser welding of metal sheets by multiple beads.

As a result, they discovered that the crack occurring in an inside bead when successively forming ring-shaped or open ring-shaped weld beads from the outside to the inside is a solidification crack and the solidification crack is affected by tensile residual stress generated at the time of outside welding.

Therefore, they discovered that when forming multiple beads, it is possible to successively form ring-shaped or open ring-shaped weld beads from the inside toward the outside to prevent cracks of the beads and form multiple beads. Further, they discovered that by adjusting the time interval when forming the inside and outside beads, or by forming the outside bead partially overlapping the inside bead, it is possible to further improve the tolerance of the welded joint to the applied load.

The present invention is a result of studies conducted based on these discoveries and has as its gist the following:

(1) A laser welded joint obtained by welding a plurality of overlaid metal sheets, comprising triple or more ring-shaped or open ring-shaped weld beads, wherein a surface hardness of the weld beads increases from an inside bead to an outside bead.

(2) A laser welding method overlaying a plurality of metal sheets and forming multiple ring-shaped or open ring-shaped weld beads to thereby weld together the overlaid metal sheets by laser irradiation, comprising the steps of forming a ring-shaped or open ring-shaped first weld bead by laser irradiation and successively forming a further two or more ring-shaped or open ring-shaped weld beads from the inside toward the outside at the outside of the first weld bead by laser irradiation.

(3) The laser welding method according to (2), wherein an outside weld bead is formed after the elapse of 0.5 sec or more from the finish time of forming an inside weld bead.

(4) The laser welding method according to (2) or (3), wherein the metal sheets are steel sheets with a C content of 0.8% or less and the second and later weld beads start to be formed after the temperature of the inside weld bead becomes the Ms point-50° C. or less.

(5) The laser welding method according to any one of (2) to (4), wherein both the first weld bead and the weld bead formed at the outside of the same are formed so as not to be overlaid.

(6) The laser welding method according to any one of (2) to (4), wherein the weld bead formed at the outermost side is formed so as to partially overlap the inside weld bead.

(7) The laser welding method according to any one of (2) to (6), wherein the weld beads are formed by remote laser welding.

Therefore, a "ring-shaped weld bead" means a bead with a circular, elliptical, oval, or polygonal path or such a bead with a partially constricted part wherein the bead path is continuous and the bead surrounds a specific range. Further, an "open ring-shaped weld bead" means a bead with a circular, elliptical, oval, or polygonal path or such a bead with a partially constricted part wherein the bead path includes a partially discontinuous part and the bead and line segment connecting the parts of the bead surround a specific range.

Further, the "outside diameter of the bead" means the maximum length of a line segment connecting any two points on the line connecting the fusion lines at the outsides of the bead (weld toe).

Advantageous Effects of Invention

According to the present invention, it is possible to prevent a crack in the beads and form multiple beads by successively forming weld beads from the inside toward the outside in laser lap welding of metal sheets forming multiple ring-shaped or open ring-shaped weld beads. As a result, it is possible to provide a laser welded joint more excellent in joint strength than the past. Further, the effect is obtained of improvement of the corrosion resistance of the inside of the beads by forming multiple ring-shaped or open ring-shaped weld beads.

BRIEF DESCRIPTION OF DRAWINGS

FIGS. 1A and 1B are views showing an outline of multiple beads formed by the laser welding method of the present invention, wherein FIG. 1A is a perspective view and FIG. 1B is a view showing a cross-section A-A' of FIG. 1A.

DESCRIPTION OF EMBODIMENTS

Figure 2:
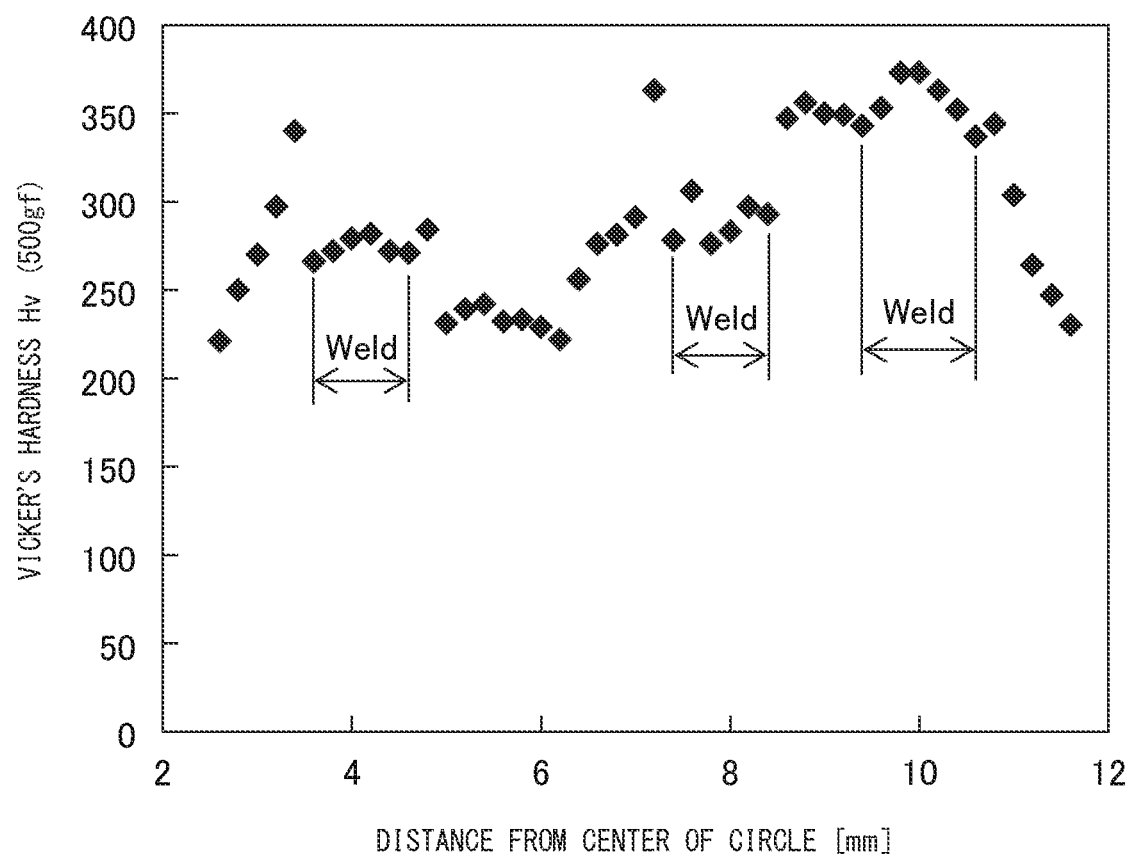
FIG. 2 is an example of a hardness profile of a weld formed by the laser welding method of the present invention.

Below, embodiments of the laser welding method of the present invention will be explained in detail while referring to the drawings. First, the basic mode of the welding method of the present invention will be explained for the case of welding using a circular ring-shaped weld bead.

Figure 5:
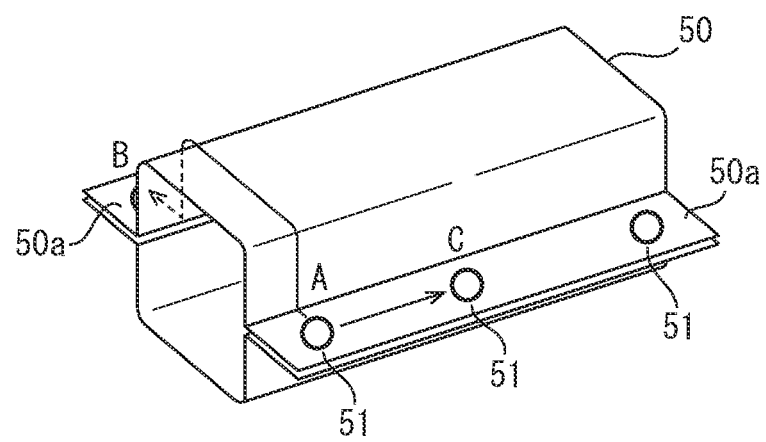
FIG. 5 is a view showing an example of laser welding a flange of a hat shaped member using ring-shaped weld beads.

When using laser welding to weld the overlaid parts of metal sheets 5, the characteristics of laser welding are used, as shown in FIG. 5, for laser welding by a ring-shaped path suitable for the size of the nuggets in resistance welding.

The art of PLT 1 forms a first bead 60 serving as the basic weld bead and forms a second bead 61 at the inside of that to be close to or overlap the first bead 60 to thereby form multiple beads. At that time, sometimes a longitudinal crack occurs at the second bead formed at the inside.

The inventors investigated the causes by observation of the fractured surfaces and as a result learned that the longitudinal crack of the second bead is a solidification crack. Therefore, the inventors further studied the reasons why the inside second bead cracks at the time of solidification.

As a result of the studies of the inventors, it was seen that cracking of the second bead tends to become more remarkable the longer the length of the ring-shaped first weld bead, that is, the larger the diameter of the ring-shaped bead. Further, it was learned that when the first weld bead is small in diameter or when forming a second bead in a region nearer the center, no crack occurs. From these facts, the inventors thought that a crack was caused by the following:

If forming the first bead, in the region surrounded by the bead, residual stress of tension occurs in the direction perpendicular to the weld line in the plane vertical to the sheet thickness direction. If second welding is performed in a region in which the residual stress of tension occurs, the constraints on the steel sheet in the region adjoining the molten bead are lifted, so due to the tensile residual stress, the sheet deforms so as to pull the molten bead in the width direction. For this reason, the second weld bead cracks in the middle of solidification before the completion of the solidification.

Therefore, the inventors studied the method of forming a second bead not affected by the residual stress of tension occurring in a direction perpendicular to the weld line in a plane vertical to the sheet thickness direction in the region surrounded by the first bead. As a result, they discovered that by successively forming a second bead and further beads not at the inside but at the outside of the first bead, it is possible to weld the sheets while preventing cracks of the second and later beads.

That is, they learned that when forming multiple beads, by successively forming the weld beads from the inside toward the outside, it is possible to form the outside bead 20 without being affected by the residual stress of tension caused at the inside of the previous bead and thereby possible to form multiple beads without causing cracks.

The present invention was made after further studying its embodiments under the above such basic principle. Below, referring to FIG. 1, the requirements and preferable requirements of the present invention will be explained.

Formation of First Weld Bead

In the present invention, a plurality of metal sheets 5 are overlaid and a laser beam is irradiated at a scheduled welding position of the overlaid metal sheets to form multiple ring-shaped weld beads and thereby weld together the overlaid metal sheets.

At this time, in the present invention, first, a laser beam is run over a predetermined welding location to form a first weld bead 10 forming the innermost side bead. By setting welding points at a plurality of locations such as in FIG. 5, a welded structural member can be produced, but here welding at a single location will be explained.

The first weld bead 10 for example is formed to an outside diameter of 3 mm to 15 mm. Note that the shape of the bead formed will be explained later, but the weld bead is not limited to a circular shape, so in the present invention, the maximum length of a line segment connecting two points of the line connecting the fusion weld lines at the outsides of the weld bead (weld toe at outsides of weld bead) will be defined as the outside diameter.

Formation of Second Bead and Later Weld Beads

Next, a laser beam is run over the outside region of the first weld bead 10 to form the second weld bead 20 and succeeding weld bead 30 successively toward the outside. To obtain the required joint strength, the number of beads from the second weld bead 20 on is made two or more beads.

When applying the present invention to for example welding a structural member of an automobile, the outermost side weld bead (outermost bead) preferably is given an outside diameter of 20 mm or less. The reason is that structural members for automobiles are being made lighter in weight. The widths of the overlaid parts such as the flanges of the members shown in FIG. 5 are also becoming narrower. Further, members are being welded by laser at a high speed by remote welding.

The width of the weld bead formed by laser, while depending on the laser apparatus used, is usually 0.5 to 1.5 mm. The number of beads able to be formed at a single weld point may be determined according to the application of weld joint and is not particularly limited. When applying the present invention to welding of a structural member for automobile use, if considering the outside diameter and bead width of the outermost bead, the maximum number of beads is about 10.

Hardnesses of Weld Beads (in Description, Unless Otherwise Indicated, Indicating Surface Hardnesses of Weld Beads)

By forming the beads in this way, the inside bead softens, so the hardnesses of the weld beads become higher the further to the outside. The hardnesses of the weld beads are obtained by measuring the Vicker's hardnesses at six to eight points or so in the width direction from the bead width and finding the average value. By establishing such a hardness profile, it is possible to raise the tensile shear strength of the joint.

FIG. 2 shows an example of the hardness profile when using the laser welding method of the present invention to form beads at 980 MPa class steel sheets by a laser output of 4 kW, welding speed of 4 m/min, in concentric shapes in the order of φ8 mm, φ16 mm, and φ20 mm every 0.9 second. The surface hardnesses of the weld beads (average values) are, in order from the inside bead, 274 Hv, 289 Hv, and 356 Hv. It is learned that the hardnesses rise the more to the outside.

The hardnesses of the weld beads are not particularly limited, but if the hardnesses are too low, the welded joint as a whole falls in strength, so 200 Hv or more is preferable and 250 Hv or more is more preferable. Further, if the hardnesses are too high, a crack easily forms at the weld zone, so 700 Hv or less is preferable and 550 Hv or less is more preferable.

Arrangement of Beads

When forming multiple weld beads, there are (i) the method of forming the weld beads so as not to overlay each other and (ii) the method of forming the inside weld bead and outside weld bead partially overlapped. With each method, the multiple beads increase the joined area of the metal sheets, so the joined strength can be further improved.

When forming the weld beads to overlap each other, by forming the outermost bead and the bead inside of it overlapped, it is possible to join the two weld beads and enlarge the width of the outermost bead. The stress received when applying a load becomes highest at the outermost bead, but by making the width of the outermost bead larger, the stress at the bonded part of the outermost weld bead can be eased and therefore the joined strength of the metal sheets can be further improved.

Time of Formation of Second Bead and Later Beads

Multiple beads can be formed by forming beads by continuously welding by remote welding. An outside weld bead is preferably formed by starting welding after the elapse of 0.5 sec or more from the timing of end of formation of an inside weld bead.

If the time from formation of an inside weld bead is short and if starting the formation of the next outside weld bead while the temperature of the inside weld bead is high, a wide region near the weld zone softens, so the joint strength falls. There is no problem no matter how long the elapsed time from the formation of an inside weld bead, but even if the elapsed time is long, there is no particular merit, the tact time increases, and the production cost rises.

For example, if the metal sheets are steel sheets having a C content of 0.65% or less, preferably a C content of 0.45% or less, by establishing an elapsed time (0.5 sec or more) between one weld bead and another weld bead, the temperature of the inside weld bead falls by 50° C. or more from the Ms point (martensite transformation starting temperature) and the amount of martensite required for securing the strength of the weld zone is formed in the inside weld bead before being affected by heat due to the formation of the outside weld bead. Further, at the outside weld bead as well, the effect of heat from the inside weld bead becomes smaller, so sufficient martensite is formed.

Shape of Weld Bead

In the present invention, laser welding is used to form a ring-shaped or open ring-shaped weld bead. A "ring-shaped weld bead" means a bead with a circular, elliptical, oval, or polygonal path or such a bead with a partially constricted part wherein the bead path is continuous and the bead surrounds a specific range. Further, an "open ring-shaped weld bead" means a bead with a circular, elliptical, oval, or polygonal path or such a bead with a partially constricted part wherein the bead path includes a partially discontinuous part and the bead and line segment connecting the parts of the bead surround a specific range.

Figure 3:
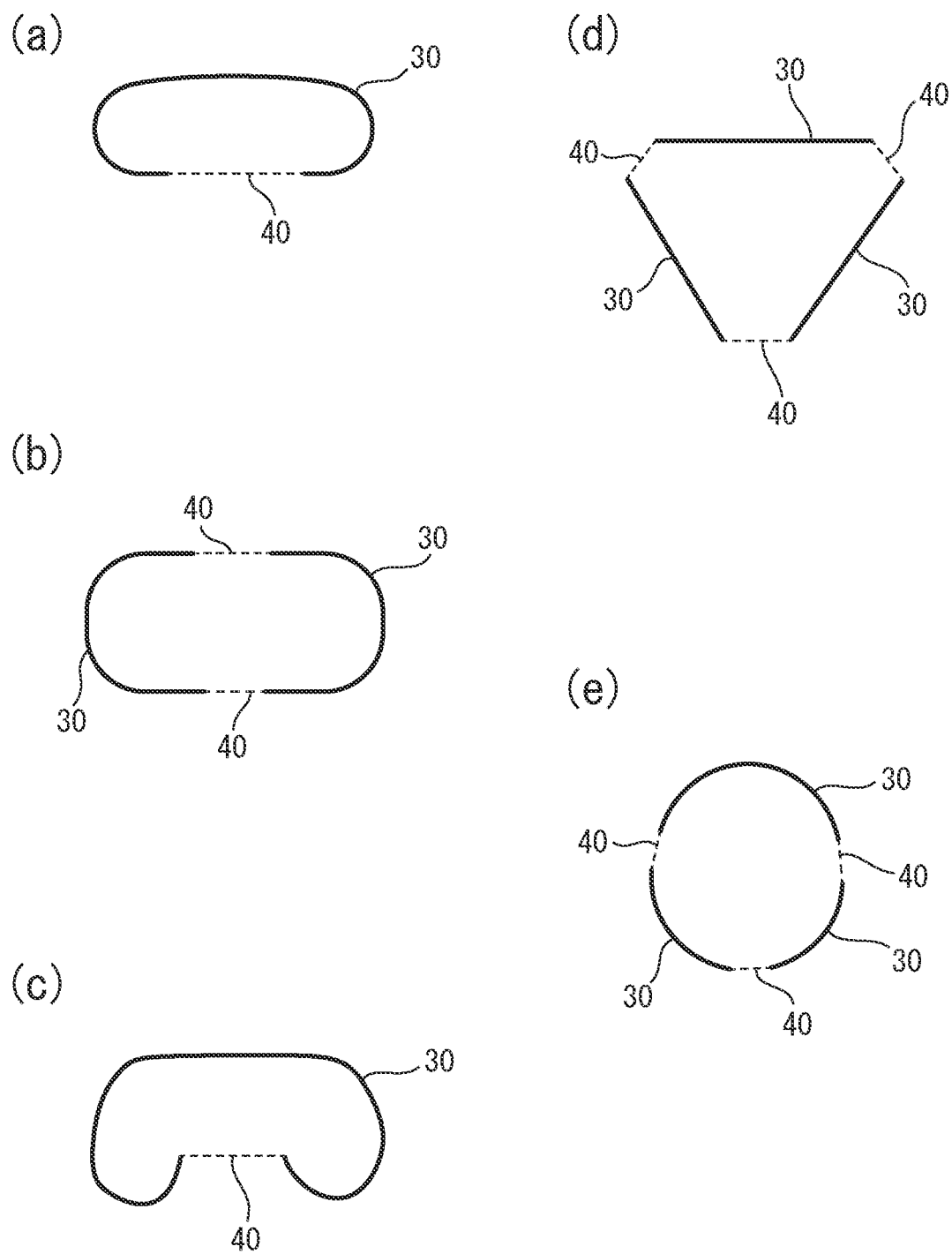
FIGS. 3A to 3E are views for explaining a bead shape of a ring-shaped weld bead.
Figure 4:
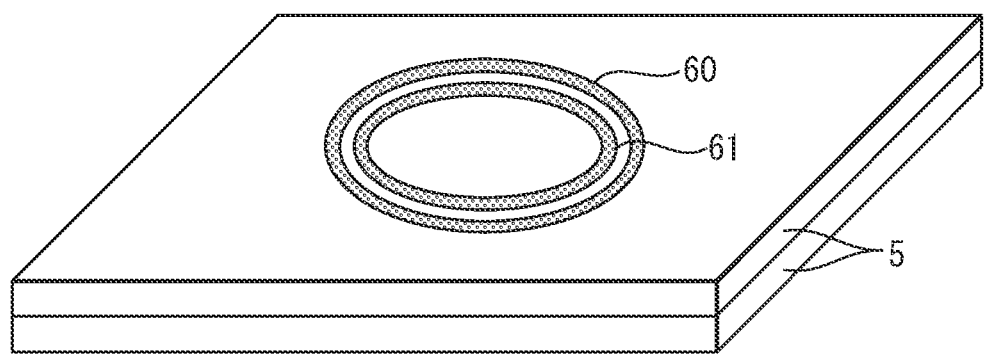
FIG. 4 is a view for explaining an example of a conventional multiple ring-shaped weld bead.

FIGS. 3A to 3E show examples of the bead shape of the third weld bead 30. The solid lines show the beads, while the broken lines shows discontinuous parts 40 of the beads. The discontinuous parts may of course be replaced with beads to form continuous beads. In FIGS. 3A to 3E, FIG. 3A shows a bead of an elliptical shape, FIG. 3B shows one of an oval shape, FIG. 3C shows one of an oval shape partially constricted, FIG. 3D shows one of a polygonal shape, and FIG. 3E shows a circular bead.

In FIGS. 3A to 3E, for simplification, the third weld bead 30 is drawn, but the first and second weld beads used are basically beads of similar shapes to the third weld bead. Further, when a fourth bead or further weld bead is formed outside of the third weld bead as well, ones similar to the third weld bead are preferable.

The weld bead is formed with a discontinuous part 4 so as to form an opening at the joined surfaces of the steel sheets. For example, when overlaying and welding galvanized steel sheets, the coated zinc between the steel sheets reaches its boiling point and evaporates resulting in a rapid expansion in volume. Unless there is a passage for steam or the vaporized zinc to escape in the region surrounded by the weld bead, the pressure between the steel sheets rises, the molten pool is splattered during the welding, and defects are formed in the weld bead. For this reason, an opening is formed at the joined surfaces of the steel sheets to enable such pressure to escape.

Width of Weld Bead

The width of the weld bead need only be a width whereby the bead will not be melted off and is usually 0.5 to 1.5 mm.

Welding Work Method

In the laser welding method of the present invention, the welding may be performed for the plurality of welding points of a flange part of a hat-shaped member etc. using either of the methods of (i) the method of successively forming multiple beads one point at a time and (ii) the method of continuously forming first weld beads at a plurality of welding points, then successively forming second weld beads at the welding points where the first weld beads were formed, then similarly forming the third weld beads and later weld beads.

In particular, the method of (ii) is suitable for the method of waiting until the temperature of the inside weld bead becomes the Ms point-50° C. or less, then forming the second and third weld beads at the outside.

In remote laser welding, it is possible to continuously weld a plurality of welding locations such as at the flange part of a hat-shaped member at a high speed. In such welding, with the method of welding the welding locations one at a time in order such as forming the first weld bead, waiting until the temperature of the first weld bead becomes the Ms point-50° C. or less, then forming the second and third weld beads at the outside, the overall welding time becomes longer and the tact time increases.

To avoid this, when forming a plurality of weld beads, by utilizing remote welding using a mirror for the focusing optical system and enabling movement of the laser spot position in a very short time and continuously forming the first beads at a plurality of welding positions, it is possible to make effective use of the wait time until forming the second weld beads.

That is, if continuously forming first weld beads at a plurality of welding positions, then continuously forming second weld beads at welding locations where the average temperature of the first weld beads becomes the Ms point-50° C. or less and forming third weld beads by remote laser welding in the same way as the second weld beads at welding locations where the temperatures of the second weld beads become the Ms point-50° C. or less, the time where no laser beam is being irradiated due to waiting becomes shorter and as a result, the total welding time is reduced.

Welding Conditions

The power density of the laser used for forming the laser welded joint of the present invention may be suitably determined by the material and thickness of the metal sheets welded.

For example, when overlaying and welding high strength steel sheets with sheet thicknesses of 0.5 to 3.0 mm or so, the power density of the laser is preferably 0.5 MW/cm$^2$ to 500 MW/cm$^2$ in range.

In the case of this example, if the power density is 0.5 MW/cm$^2$ or more, keyhole welding where the laser beam passes through the sheet thickness direction becomes possible. Further, even in a slow welding speed range, the previously formed bead can be tempered by the later formed bead. If the power density is lower than 0.5 MW/cm$^2$, no keyhole is formed, so to realize penetration welding, it is necessary to remarkably lower the speed of movement of the laser beam, that is, the welding speed, so this is disadvantageous in actual production. On the other hand, if the power density is higher than 500 MW/cm$^2$, at the beam irradiated part, evaporation becomes dominant, so utilization as a heat source for fusion welding is not possible and formation of a bead becomes difficult.

Metal Sheets Used for Laser Welded joint

The metal sheets used for the laser welded joint of the present invention are not particularly limited. However, if the sheet thickness becomes thin, while an effect of improvement of strength of the weld zone is obtained, the strength of the joint is dominated by the sheet thickness, so the effect of improvement of strength of the joint as a whole becomes smaller. Even if the sheet thickness becomes thick, the effect of improvement of strength of the weld zone by the present invention can be obtained.

The laser welding method of the present invention is particularly suitable for overlay welding of high strength steel sheets having a sheet thickness of 0.5 to 3.0 mm in range where the effect of improvement of joint strength is effectively obtained and the member is made lighter in weight. Further, in the case of high strength steel sheets, as explained above, martensite transformation occurs at the time of cooling after formation of the weld bead, so further improvement of the strength of the joint can be expected.

In the present invention, by using laser welding to form multiple ring-shaped or open ring-shaped weld beads in the above way, it is possible to produce a laser welded joint where the joint strength is further improved and the corrosion resistance at the inside of the bead is also improved.

Note that in the above invention, welding of high strength steel sheets for automobile use was explained, but the present invention is not limited to this. As applications, application to members for other vehicles, members for household electrical appliances, building materials, ships, etc. also becomes possible. Furthermore, the metal sheets are also not limited to high strength steel sheets. Application to other steel, stainless steel, aluminum alloy, titanium alloy, etc. is also possible.

EXAMPLES

Example 1

Two high strength steel sheets of thicknesses of 1.0 mm and mainly comprised of C: 0.13%, Si: 0.9%, Mn: 2.2%, P: 0.01%, and S: 0.004% were overlaid and welded by laser welding to prepare a laser welded joint. Furthermore, a joint using a 5000-series aluminum alloy comprised of sheet thickness 1.2 mm A5083 and a joint using a representative titanium alloy comprised of sheet thickness 1.0 mm Ti-6% Al-4% V alloy were similarly prepared.

The shapes of the beads of the weld zone were made closed circular shapes or the shapes shown in FIG. 3A to FIG. 3E. Joints having three or four weld beads and also a joint having only a single bead were prepared.

A plurality of types of laser welded joints were prepared by changing the shapes or sizes of the weld beads, bead widths, positions of formation of the beads, etc. In some of the examples, the outermost circumference bead and the bead at the inside of the same contacted or were arranged to be overlaid.

The conditions in the case of steel sheets are shown in Table 1 and Tables 2-1 to 2-5. Furthermore, the conditions in the case of aluminum sheets are shown in Table 3 and Tables 4-1 to 4-5, while the conditions in the case of titanium alloy are shown in Table 5 and Tables 6-1 to 6-5. The bead widths were all made the same bead widths for single weld points.

Regarding the outside diameter of the weld zone, if the shape of the weld bead is circular, this was made the outside diameter of the weld bead measured at the outside weld toe of the weld bead at the sheet surface at the side irradiated by the laser, while in the case of the shapes shown in FIGS. 3A to 3E, the maximum length of the line segment connecting two points on the line connecting the fusion welding lines at the outsides of the weld bead (outside weld toe) was made the outside diameter of the weld bead, but in either case, the diameter of the weld bead positioned at the outermost side was made a constant 20 mm.

Note that, Table 1, Table 3, and Table 5 correspond to the case of forming beads concentrically, while the shapes of the weld beads of Tables 2-1 to 2-5, Tables 4-1 to 4-5, and Tables 6-1 to 6-5 correspond to the shapes of FIGS. 3A to 3E in that order. Further, in Tables 1 to 6, the underlines indicate outside the scopes prescribed by the present invention.

As for the other welding conditions, the laser output was made 4.0 kW, the focal position was made the surface of the top steel sheet, and the beam spot diameter at the focal position was made 0.5 mm. Further, the welding speed was made a constant 4 m/min.

The prepared laser welded joint was checked for cracks by X-ray transmission test and measured for tensile shear strength (TSS) and cross tension strength (CTS).

The measurement method and the joint shape of the tensile shear strength were based on JIS Z 3137 prescribing resistance spot welded joints, while the measurement method and the joint shape for cross tension strength were based on JIS Z 3137. That is, the prepared joints were tested by tensile tests using predetermined tensile jigs and using tensile speeds of constant 10 mm/min. The maximum loads were defined as the tensile shear strength and cross tension strength.

For the bead shapes of the concentric shapes and FIGS. 3A to 3E, only the case of no cracks in the beads and of cross tension strengths of 1.0 time or more the strength in the case of forming only one bead (steel sheets: Nos. 5, 12, 18, 24, 30, and 36, aluminum alloy: Nos. 43, 50, 56, 62, 68, and 74, titanium alloy: Nos. 81, 88, 94, 100, 106, and 112) was judged as good. The case of cross tension strengths of less than 1.0 time that or of cracks in the beads was judged as poor. Tables 1 to 6 show these results.

TABLE 1

| No. | Bead shape | Bead width (mm) | 1st formed bead outside diameter (mm) | 2nd formed bead outside diameter (mm) | 3rd formed bead outside diameter (mm) | 4th formed bead outside diameter (mm) | 5th formed bead outside diameter (mm) | Time from end of formation of 1st bead to start of formation of 2nd bead (s) | Time from 2nd to 3rd formation (s) | Time from 3rd to 4th formation (s) * | Time from 4th to 5th formation (s) | Bead cracking | Tensile shear strength ratio | Cross tension strength ratio |
|---|---|---|---|---|---|---|---|---|---|---|---|---|---|---|
| 1 | Invention example | 3 circles | 1 | 10 | 17 | 20 | — | — | 0.8 | 0.9 | — | — | None | 2.4 | 1 |
| 2 | Invention example | 3 circles | 1 | 10 | 19 | 20 | — | — | 0.6 | 1 | — | — | None | 2.4 | 1.1 |
| 3 | Invention example | 4 circles | 1 | 8 | 10 | 18 | 20 | — | 7 | 1.2 | 1 | — | None | 2.8 | 1 |
| 4 | Invention example | 5 circles | 1 | 5 | 8 | 10 | 18 | 20 | 8 | 0.6 | 0.5 | 0.7 | None | 2.9 | 1 |
| 5 | Comparative example | 1 circle | 1 | 20 | — | — | — | — | — | — | — | — | None | 1 | 1 |
| 6 | Comparative example | 3 circles | 1 | 20 | 18 | 10 | — | — | 8 | 2.2 | — | — | Yes | 1.3 | 0.9 |
| 7 | Comparative example | 4 circles | 1 | 20 | 18 | 10 | 8 | — | 0.2 | 8 | 1 | — | Yes | 1.3 | 0.8 |
| 8 | Comparative example | 5 circles | 1 | 20 | 18 | 10 | 8 | 5 | 7 | 0.8 | 1 | 0.9 | Yes | 1.3 | 0.7 |

* "Time from $N_0$-th to $N_1$-th formation" means "time from end of formation of $N_0$-th bead to start of formation of $N_1$-th bead".

TABLE 2-1

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|---|---|---|---|---|---|---|
| 9 | Invention example | 3 of FIG. 3A | 1.2 | 12 | 15 | 20 | — | 1.2 | 0.8 | — | None | 2.3 | 1 |
| 10 | Invention example | 3 of FIG. 3A | 1.2 | 12 | 19 | 20 | — | 1.3 | 0.7 | — | None | 2.1 | 1.1 |
| 11 | Invention example | 4 of FIG. 3A | 1.2 | 8 | 12 | 15 | 20 | 8 | 0.5 | 0.8 | None | 2.7 | 1 |
| 12 | Comparative example | 1 of FIG. 3A | 1.2 | 20 | — | — | — | — | — | — | None | 1 | 1 |
| 13 | Comparative example | 3 of FIG. 3A | 1.2 | 20 | 18 | 15 | — | 8 | 0.4 | — | Yes | 1.1 | 1 |
| 14 | Comparative example | 4 of FIG. 3A | 1.2 | 20 | 15 | 12 | 8 | 7.5 | 0.9 | 0.7 | Yes | 1.2 | 1 |

* "Time from $N_0$-th to $N_1$-th formation" means "time from end of formation of $N_0$-th bead to start of formation of $N_1$-th bead".

TABLE 2-2

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|---|---|---|---|---|---|---|
| 15 | Invention example | 3 of FIG. 3B | 1.3 | 14 | 16 | 20 | — | 5 | 1.4 | — | None | 2.5 | 1 |
| 16 | Invention example | 3 of FIG. 3B | 1.3 | 14 | 19 | 20 | — | 0.7 | 1.2 | — | None | 2.2 | 1.1 |
| 17 | Invention example | 4 of FIG. 3B | 1.3 | 6 | 12 | 16 | 20 | 8.5 | 0.5 | 0.8 | None | 2.7 | 1 |
| 18 | Comparative example | 1 of FIG. 3B | 1.3 | 20 | — | — | — | — | — | — | None | 1 | 1 |
| 19 | Comparative example | 3 of FIG. 3B | 1.3 | 20 | 16 | 14 | — | 9 | 0.4 | — | Yes | 1.1 | 0.8 |
| 20 | Comparative example | 4 of FIG. 3B | 1.3 | 20 | 16 | 12 | 6 | 7 | 0.9 | 0.7 | Yes | 1.3 | 1 |

* "Time from $N_0$-th to $N_1$-th formation" means "time from end of formation of $N_0$-th bead to start of formation of $N_1$-th bead".

TABLE 2-3

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|---|---|---|---|---|---|---|
| 21 | Invention example | 3 of FIG. 3C | 1.2 | 8 | 16 | 20 | — | 0.8 | 1.2 | — | None | 2.2 | 1 |
| 22 | Invention example | 3 of FIG. 3C | 1.2 | 8 | 19 | 20 | — | 0.6 | 1 | — | None | 1.8 | 1.1 |
| 23 | Invention example | 4 of FIG. 3C | 1.2 | 6 | 12 | 16 | 20 | 10 | 0.7 | 0.5 | None | 2.6 | 1 |
| 24 | Comparative example | 1 of FIG. 3C | 1.2 | 20 | — | — | — | — | — | — | None | 1 | 1 |

TABLE 2-3-continued

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|---|---|---|---|---|---|---|
| 25 | Comparative example | 3 of FIG. 3C | 1.2 | 20 | 18 | 8 | — | 10 | 0.4 | — | Yes | 1.1 | 0.9 |
| 26 | Comparative example | 4 of FIG. 3C | 1.2 | 20 | 18 | 12 | 8 | 8 | 0.9 | 0.7 | Yes | 1.4 | 1 |

* "Time from $N_0$-th to $N_1$-th formation" means "time from end of formation of $N_0$-th bead to start of formation of $N_1$-th bead".

TABLE 2-4

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 27 | Invention example | 3 of FIG. 3D | 1.4 | 8 | 16 | 20 | — |
| 28 | Invention example | 3 of FIG. 3D | 1.4 | 8 | 18 | 20 | — |
| 29 | Invention example | 4 of FIG. 3D | 1.4 | 6 | 8 | 19 | 20 |
| 30 | Comparative example | 1 of FIG. 3D | 1.4 | 20 | — | — | — |
| 31 | Comparative example | 3 of FIG. 3D | 1.4 | 20 | 19 | 8 | — |
| 32 | Comparative example | 4 of FIG. 3D | 1.4 | 20 | 19 | 8 | 6 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 27 | 0.9 | 0.5 | — | None | 2.2 | 1 |
| 28 | 9 | 0.8 | — | None | 1.9 | 1.1 |
| 29 | 1 | 0.7 | 2 | None | 2.6 | 1.1 |
| 30 | — | — | — | None | 1 | 1 |
| 31 | 8 | 0.3 | — | Yes | 1.2 | 0.8 |
| 32 | 9 | 0.5 | 2 | Yes | 1.2 | 0.7 |

* ... "Time from $N_0$-th to $N_1$-th formation" means "time from end of formation of $N_0$-th bead to start of formation of $N_1$-th bead".

TABLE 2-5

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 33 | Invention example | 3 of FIG. 3E | 1.1 | 10 | 17 | 20 | — |
| 34 | Invention example | 3 of FIG. 3E | 1.1 | 10 | 19 | 20 | — |
| 35 | Invention example | 4 of FIG. 3E | 1.1 | 4 | 10 | 19 | 20 |
| 36 | Comparative example | 1 of FIG. 3E | 1.1 | 20 | — | — | — |
| 37 | Comparative example | 3 of FIG. 3E | 1.1 | 20 | 19 | 10 | — |
| 38 | Comparative example | 4 of FIG. 3E | 1.1 | 20 | 19 | 10 | 4 |

TABLE 2-5-continued

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 33 | 1.1 | 0.8 | — | None | 2.4 | 1 |
| 34 | 7 | 0.7 | — | None | 2 | 1.1 |
| 35 | 9 | 1.4 | 1.3 | None | 2.6 | 1.1 |
| 36 | — | — | — | None | 1 | 1 |
| 37 | 8 | <u>0.3</u> | — | Yes | 1.2 | 0.9 |
| 38 | 7.7 | 0.4 | 2 | Yes | 1.2 | 0.7 |

* ... "Time from $N_0$-th to $N_1$-th formation" means "time from end of formation of $N_0$-th bead to start of formation of $N_1$-th bead".

TABLE 3

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | 5th formed bead outside diameter (mm) |
|---|---|---|---|---|---|---|---|---|
| 39 | Invention example | 3 circles | 1 | 8 | 10 | 20 | — | — |
| 40 | Invention example | 3 circles | 1 | 12 | 19 | 20 | — | — |
| 41 | Invention example | 4 circles | 1 | 8 | 12 | 16 | 20 | — |
| 42 | Invention example | 5 circles | 1 | 6 | 8 | 12 | 16 | 20 |
| 43 | Comparative example | 1 circle | 1 | 20 | — | — | — | — |
| 44 | Comparative example | 3 circles | 1 | 20 | <u>16</u> | <u>10</u> | — | — |
| 45 | Comparative example | 4 circles | 1 | 20 | <u>18</u> | <u>12</u> | <u>8</u> | — |
| 46 | Comparative example | 5 circles | 1 | 20 | <u>18</u> | <u>14</u> | <u>8</u> | <u>5</u> |

| No. | Time from end of formation of 1st bead to start of formation of 2nd bead (s) | Time from 2nd to 3rd formation (s) | Time from 3rd to 4th formation (s) * | Time from 4th to 5th formation (s) | Bead cracking | Tensile shear strength ratio | Cross tension strength ratio |
|---|---|---|---|---|---|---|---|
| 39 | 8.2 | 0.9 | — | — | None | 1.9 | 1 |
| 40 | 7 | 1.3 | — | — | None | 2.6 | 1 |
| 41 | 6.5 | 0.5 | 1.3 | — | None | 2.8 | 1 |
| 42 | 12 | 0.8 | 1.2 | 0.5 | None | 3.1 | 1 |
| 43 | — | — | — | — | None | 1 | 1 |
| 44 | 8 | 2.2 | — | — | Yes | 1.4 | 0.9 |
| 45 | 7 | <u>0.4</u> | 1 | — | Yes | 1.5 | 0.8 |
| 46 | 6 | <u>0.3</u> | 1 | 0.9 | Yes | 1.4 | 0.9 |

* ... "Time from $N_0$-th to $N_1$-th formation" means "time from end of formation of $N_0$-th bead to start of formation of $N_1$-th bead".

TABLE 4-1

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 47 | Invention example | 3 of FIG. 3A | 1.2 | 14 | 16 | 20 | — |
| 48 | Invention example | 3 of FIG. 3A | 1.2 | 14 | 19 | 20 | — |
| 49 | Invention example | 4 of FIG. 3A | 1.2 | 8 | 12 | 17 | 20 |
| 50 | Comparative example | 1 of FIG. 3A | 1.2 | 20 | — | — | — |

TABLE 4-1-continued

| | | | | | | | |
|---|---|---|---|---|---|---|---|
| 51 | Comparative example | 3 of FIG. 3A | 1.2 | 20 | <u>16</u> | <u>13</u> | — |
| 52 | Comparative example | 4 of FIG. 3A | 1.2 | 20 | <u>15</u> | <u>10</u> | <u>8</u> |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 47 | 1.4 | 14 | — | None | 2.5 | 1 |
| 48 | 3.3 | 5.5 | — | None | 2.2 | 1.1 |
| 49 | 0.5 | 3.5 | 1.5 | None | 2.9 | 1 |
| 50 | — | — | — | None | 1 | 1 |
| 51 | 8 | <u>0.3</u> | — | Yes | 1.2 | 1 |
| 52 | 6.5 | 0.9 | <u>0.4</u> | Yes | 1.3 | 1 |

* ... "Time from $N_0$-th to $N_1$-th formation" means "time from end of formation of $N_0$-th bead to start of formation of $N_1$-th bead".

TABLE 4-2

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 53 | Invention example | 3 of FIG. 3B | 1.3 | 14 | 16 | 20 | — |
| 54 | Invention example | 3 of FIG. 3B | 1.3 | 15 | 18 | 20 | — |
| 55 | Invention example | 4 of FIG. 3B | 1.3 | 6 | 12 | 16 | 20 |
| 56 | Comparative example | 1 of FIG. 3B | 1.3 | 20 | — | — | — |
| 57 | Comparative example | 3 of FIG. 3B | 1.3 | 20 | <u>16</u> | <u>13</u> | — |
| 58 | Comparative example | 4 of FIG. 3B | 1.3 | 20 | <u>14</u> | <u>12</u> | <u>7</u> |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 53 | 5.5 | 3 | — | None | 2.6 | 1 |
| 54 | 0.7 | 1.5 | — | None | 2.2 | 1.1 |
| 55 | 7 | 1.2 | 0.5 | None | 2.7 | 1 |
| 56 | — | — | — | None | 1 | 1 |
| 57 | 7.5 | <u>0.4</u> | — | Yes | 1.1 | 0.9 |
| 58 | 8 | <u>0.3</u> | 1.3 | Yes | 1.3 | 1 |

* ... "Time from $N_0$-th to $N_1$-th formation" means "time from end of formation of $N_0$-th bead to start of formation of $N_1$-th bead".

TABLE 4-3

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 59 | Invention example | 3 of FIG. 3C | 1.2 | 6 | 15 | 20 | — |
| 60 | Invention example | 3 of FIG. 3C | 1.2 | 7 | 18 | 20 | — |
| 61 | Invention example | 4 of FIG. 3C | 1.2 | 6 | 12 | 16 | 20 |
| 62 | Comparative example | 1 of FIG. 3C | 1.2 | 20 | — | — | — |

TABLE 4-3-continued

| | | | | | | | |
|---|---|---|---|---|---|---|---|
| 63 | Comparative example | 3 of FIG. 3C | 1.2 | 20 | 18 | 8 | — |
| 64 | Comparative example | 4 of FIG. 3C | 1.2 | 20 | 18 | 12 | 8 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 59 | 6.5 | 3.2 | — | None | 2.2 | 1 |
| 60 | 5 | 1.2 | — | None | 1.8 | 1.1 |
| 61 | 8 | 0.5 | 0.8 | None | 2.6 | 1 |
| 62 | — | — | — | None | 1 | 1 |
| 63 | 8 | 0.4 | — | Yes | 1.3 | 0.9 |
| 64 | 1 | 7.5 | 0.8 | Yes | 1.4 | 1 |

* . . . "Time from $N_0$-th to $N_1$-th formation" means "time from end of formation of $N_0$-th bead to start of formation of $N_1$-th bead".

TABLE 4-4

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 65 | Invention example | 3 of FIG. 3D | 1.4 | 12 | 17 | 20 | — |
| 66 | Invention example | 3 of FIG. 3D | 1.4 | 10 | 18 | 20 | — |
| 67 | Invention example | 4 of FIG. 3D | 1.4 | 7 | 10 | 19 | 20 |
| 68 | Comparative example | 1 of FIG. 3D | 1.4 | 20 | — | — | — |
| 69 | Comparative example | 3 of FIG. 3D | 1.4 | 20 | 17 | 10 | — |
| 70 | Comparative example | 4 of FIG. 3D | 1.4 | 20 | 19 | 12 | 8 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 65 | 1.3 | 0.5 | — | None | 2.5 | 1 |
| 66 | 3.5 | 0.7 | — | None | 2 | 1.1 |
| 67 | 8 | 0.6 | 2 | None | 2.8 | 1 |
| 68 | — | — | — | None | 1 | 1 |
| 69 | 8 | 0.4 | — | Yes | 1.2 | 0.9 |
| 70 | 7.5 | 0.7 | 1.8 | Yes | 1.3 | 0.9 |

* . . . "Time from $N_0$-th to $N_1$-th formation" means "time from end of formation of $N_0$-th bead to start of formation of $N_1$-th bead".

TABLE 4-5

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 71 | Invention example | 3 of FIG. 3E | 1.1 | 12 | 16 | 20 | — |
| 72 | Invention example | 3 of FIG. 3E | 1.1 | 8 | 19 | 20 | — |
| 73 | Invention example | 4 of FIG. 3E | 1.1 | 6 | 12 | 19 | 20 |
| 74 | Comparative example | 1 of FIG. 3E | 1.1 | 20 | — | — | — |

TABLE 4-5-continued

| No. | | | | | | |
|---|---|---|---|---|---|---|
| 75 | Comparative example | 3 of FIG. 3E | 1.1 | 20 | 17 | 12 | — |
| 76 | Comparative example | 4 of FIG. 3E | 1.1 | 20 | 16 | 10 | 6 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 71 | 1.6 | 2.1 | — | None | 2.4 | 1 |
| 72 | 9 | 0.9 | — | None | 1.9 | 1.1 |
| 73 | 0.5 | 1.2 | 1.5 | None | 2.9 | 1.1 |
| 74 | — | — | — | None | 1 | 1 |
| 75 | 8 | 0.3 | — | Yes | 1.1 | 0.8 |
| 76 | 9 | 0.7 | 2 | Yes | 1.2 | 0.9 |

* . . . "Time from $N_0$-th to $N_1$-th formation" means "time from end of formation of $N_0$-th bead to start of formation of $N_1$-th bead".

TABLE 5

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | 5th formed bead outside diameter (mm) |
|---|---|---|---|---|---|---|---|---|
| 77 | Invention example | 3 circles | 1 | 8 | 14 | 20 | — | — |
| 78 | Invention example | 3 circles | 1 | 8 | 19 | 20 | — | — |
| 79 | Invention example | 4 circles | 1 | 8 | 10 | 16 | 20 | — |
| 80 | Invention example | 5 circles | 1 | 5 | 8 | 12 | 18 | 20 |
| 81 | Comparative example | 1 circles | 1 | 20 | — | — | — | — |
| 82 | Comparative example | 3 circles | 1 | 20 | 16 | 10 | — | — |
| 83 | Comparative example | 4 circles | 1 | 20 | 18 | 12 | 8 | — |
| 84 | Comparative examples | 5 circles | 1 | 20 | 17 | 10 | 8 | 5 |

| No. | Time from end of formation of 1st bead to start of formation of 2nd bead (s) | Time from 2nd to 3rd formation (s) | Time from 3rd to 4th formation (s) * | Time from 4th to 5th formation (s) | Bead cracking | Tensile shear strength ratio | Cross tension strength ratio |
|---|---|---|---|---|---|---|---|
| 77 | 8 | 1 | — | — | None | 2.1 | 1 |
| 78 | 7.7 | 2 | — | — | None | 2.4 | 1 |
| 79 | 0.8 | 1.2 | 1 | — | None | 2.7 | 1 |
| 80 | 5.5 | 0.5 | 1.3 | 1.2 | None | 3.1 | 1 |
| 81 | — | — | — | — | None | 1 | 1 |
| 82 | 8 | 2.2 | — | — | Yes | 1.4 | 0.9 |
| 83 | 7 | 1.2 | 0.3 | — | Yes | 1.5 | 0.9 |
| 84 | 0.1 | 7.5 | 1 | 0.9 | Yes | 1.4 | 0.8 |

* . . . "Time from $N_0$-th to $N_1$-th formation" means "time from end of formation of $N_0$-th bead to start of formation of $N_1$-th bead".

TABLE 6-1

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 85 | Invention example | 3 of FIG. 3A | 1.2 | 6 | 15 | 20 | — |
| 86 | Invention example | 3 of FIG. 3A | 1.2 | 12 | 19 | 20 | — |

TABLE 6-1-continued

| No. | | | | | | | |
|---|---|---|---|---|---|---|---|
| 87 | Invention example | 4 of FIG. 3A | 1.2 | 7 | 10 | 16 | 20 |
| 88 | Comparative example | 1 of FIG. 3A | 1.2 | 20 | — | — | — |
| 89 | Comparative example | 3 of FIG. 3A | 1.2 | 20 | 17 | 13 | — |
| 90 | Comparative example | 4 of FIG. 3A | 1.2 | 20 | 14 | 10 | 6 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 85 | 7.6 | 1.3 | — | None | 2.1 | 1 |
| 86 | 6 | 0.7 | — | None | 2.1 | 1.1 |
| 87 | 8 | 0.5 | 0.8 | None | 2.7 | 1 |
| 88 | — | — | — | None | 1 | 1 |
| 89 | 7 | 0.3 | — | Yes | 1.2 | 1 |
| 90 | 1.6 | 7 | 0.6 | Yes | 1.2 | 1 |

* ... "Time from $N_0$-th to $N_1$-th formation" means "time from end of formation of $N_0$-th bead to start of formation of $N_1$-th bead".

TABLE 6-2

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 91 | Invention example | 3 of FIG. 3B | 1.3 | 8 | 17 | 20 | — |
| 92 | Invention example | 3 of FIG. 3B | 1.3 | 12 | 19 | 20 | — |
| 93 | Invention example | 4 of FIG. 3B | 1.3 | 6 | 11 | 17 | 20 |
| 94 | Comparative example | 1 of FIG. 3B | 1.3 | 20 | — | — | — |
| 95 | Comparative example | 3 of FIG. 3B | 1.3 | 20 | 16 | 14 | — |
| 96 | Comparative example | 4 of FIG. 3B | 1.3 | 20 | 17 | 14 | 8 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 91 | 1.2 | 0.6 | — | None | 2.3 | 1 |
| 92 | 6.5 | 1.5 | — | None | 2.1 | 1.1 |
| 93 | 8 | 1.2 | 0.8 | None | 2.7 | 1 |
| 94 | — | — | — | None | 1 | 1 |
| 95 | 8 | 0.4 | — | Yes | 1.1 | 0.9 |
| 96 | 2.1 | 7 | 1.2 | Yes | 1.3 | 1 |

* ... "Time from $N_0$-th to $N_1$-th formation" means "time from end of formation of $N_0$-th bead to start of formation of $N_1$-th bead".

TABLE 6-3

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 97 | Invention example | 3 of FIG. 3C | 1.2 | 10 | 17 | 20 | — |
| 98 | Invention example | 3 of FIG. 3C | 1.2 | 12 | 19 | 20 | — |
| 99 | Invention example | 4 of FIG. 3C | 1.2 | 6 | 14 | 18 | 20 |

TABLE 6-3-continued

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 100 | Comparative example | 1 of FIG. 3C | 1.2 | 20 | — | — | — |
| 101 | Comparative example | 3 of FIG. 3C | 1.2 | 20 | <u>17</u> | <u>12</u> | — |
| 102 | Comparative example | 4 of FIG. 3C | 1.2 | 20 | <u>16</u> | <u>10</u> | <u>6</u> |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 97 | 0.8 | 1.2 | — | None | 2.4 | 1 |
| 98 | 8 | 1 | — | None | 2.1 | 1 |
| 99 | 5 | 0.5 | 0.8 | None | 2.9 | 1 |
| 100 | — | — | — | None | 1 | 1 |
| 101 | 9 | <u>0.2</u> | — | Yes | 1.2 | 0.9 |
| 102 | 7.3 | <u>0.9</u> | 0.7 | Yes | 1.1 | 0.8 |

* ... "Time from $N_0$-th to $N_1$-th formation" means "time from end of formation of $N_0$-th bead to start of formation of $N_1$-th bead".

TABLE 6-4

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 103 | Invention example | 3 of FIG. 3D | 1.4 | 5 | 16 | 20 | — |
| 104 | Invention example | 3 of FIG. 3D | 1.4 | 8 | 18 | 20 | — |
| 105 | Invention example | 4 of FIG. 3D | 1.4 | 6 | 10 | 19 | 20 |
| 106 | Comparative example | 1 of FIG. 3D | 1.4 | 20 | — | — | — |
| 107 | Comparative example | 3 of FIG. 3D | 1.4 | 20 | <u>17</u> | <u>6</u> | — |
| 108 | Comparative example | 4 of FIG. 3D | 1.4 | 20 | <u>18</u> | <u>10</u> | <u>6</u> |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 103 | 10 | 0.5 | — | None | 2.1 | 1 |
| 104 | 1.5 | 0.5 | — | None | 1.9 | 1 |
| 105 | 0.8 | 0.7 | 2 | None | 2.8 | 1 |
| 106 | — | — | — | None | 1 | 1 |
| 107 | 9 | <u>0.3</u> | — | Yes | 1.2 | 0.9 |
| 108 | 8 | <u>0.5</u> | 2 | Yes | 1.2 | 0.9 |

* ... "Time from $N_0$-th to $N_1$-th formation" means "time from end of formation of $N_0$-th bead to start of formation of $N_1$-th bead".

TABLE 6-5

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) |
|---|---|---|---|---|---|---|---|
| 109 | Invention example | 3 of FIG. 3E | 1.1 | 8 | 16 | 20 | — |
| 110 | Invention example | 3 of FIG. 3E | 1.1 | 12 | 19 | 20 | — |
| 111 | Invention example | 4 of FIG. 3E | 1.1 | 4 | 12 | 19 | 20 |
| 112 | Comparative example | 1 of FIG. 3E | 1.1 | 20 | — | — | — |

TABLE 6-5-continued

| | | | | | | |
|---|---|---|---|---|---|---|
| 113 | Comparative example | 3 of FIG. 3E | 1.1 | 20 | 17 | 8 | — |
| 114 | Comparative example | 4 of FIG. 3E | 1.1 | 20 | 18 | 9 | 6 |

| No. | Time from end of formation of 1st bead to start of formation of 2nd bead (s) | Time from 2nd to 3rd formation (s) | Time from 3rd to 4th formation (s) * | Bead cracking | Tensile shear strength ratio | Cross tension strength ratio |
|---|---|---|---|---|---|---|
| 109 | 9 | 0.8 | — | None | 2.2 | 1 |
| 110 | 0.9 | 0.7 | — | None | 2 | 1 |
| 111 | 0.5 | 1.4 | 1.3 | None | 2.8 | 1 |
| 112 | — | — | — | None | 1 | 1 |
| 113 | 10 | 0.3 | — | Yes | 1.1 | 0.9 |
| 114 | 11 | 1.4 | 2 | Yes | 1.1 | 0.9 |

* . . . "Time from $N_0$-th to $N_1$-th formation" means "time from end of formation of $N_0$-th bead to start of formation of $N_1$-th bead".

As will be understood from the results of Tables 1 to 6, according to the present invention, it was possible to obtain laser welded joints excellent in joint strength without causing the beads to crack.

In particular, regarding the tensile shear strength, the joined area of the weld beads between the steel sheets increased, so a major improvement in strength was seen.

Note that, in the invention examples of Tables 1 to 6, in Nos. 2, 10, 16, 22, 28, and 34 of steel sheets, Nos. 40, 48, 54, 60, 66, and 72 of aluminum alloys, and Nos. 78, 86, 92, 98, 104, and 110 of titanium alloys, the weld beads formed at the outermost side and the beads at the inside of the same were formed so as to be partially overlaid. The weld beads of the other invention examples were formed so that none of the first weld beads and weld beads formed at the outsides were overlaid.

As opposed to this, if the requirements of the present invention are not satisfied, the joint strength is inferior compared with the present invention or the bead cracks.

Nos. 6 to 8, 13, 14, 19, 20, 25, 26, 31, 32, 37, and 38 of steel sheets, Nos. 44 to 46, 51, 52, 57, 58, 63, 64, 69, 70, 75, and 76 of aluminum alloys, and Nos. 82 to 84, 89, 90, 95, 96, 101, 102, 107, 108, 113, and 114 of titanium alloys are comparative examples forming welded joints by three or more beads. Beads were formed at the insides of the first beads, so cracks occurred in the second and further formed beads. Compared with the invention examples, the tensile shear strength became greatly inferior.

In particular, Nos. 7, 8, 19, 25, 32, and 38 forming beads at the steel sheets had the second beads formed while the temperatures of the first beads had not sufficiently fallen, so sufficient martensite was not formed at the first bead, the steels excessively softened, and the cross tension strengths greatly fell.

Example 2

Furthermore, the inventors investigated the tensile shear strength when limiting the outside diameter of the bead position at the outermost side to 10 mm for comparing the present invention and PLT 2 (Japanese Patent Publication No. 2012-240086A) envisioning narrow flange parts when welding steel sheets. Note that, the tensile test method was based on the method in Example 1. The results when forming 3 circles (No. 116) and 5 circles (No. 117) concentrically in accordance with PLT 2 as the method of comparison based on the tensile shear strength of the case of forming four beads of the present invention in a concentric manner (4 circles, No. 115) are shown in Table 7.

In the case of a 3 circles, the first bead is defined as the main bead, the second bead is defined as the compression field providing bead, and the third bead was defined as the tempered bead for the first bead. In the case of a 5 circles, further beads were added to the case of the 3 circles, the fourth bead was defined as the compression field providing bead, and the fifth bead was defined as the tempered bead. The time from the start to end of formation of the beads was set to satisfy the requirements of the invention. The case where the tensile shear strength of the prepared joint is inferior to the reference was judged as poor.

Neither of the weld beads formed in accordance with the present invention and PLT 2 cracked, but in the case of a 3 circles, the joint strength was inferior since the joined area of the steel sheets was smaller than the present invention. Further, in the case of a 5 circles, a limited area was formed by weld beads with fixed distances between them, so the once formed third bead was again welded with the fifth bead, the thickness of the weld metal in the sheet thickness direction was reduced due to spattering, and the joint strength became inferior to the present invention.

TABLE 7

| No. | | Bead shape | Bead width (mm) | 1st formed bead outside diameter (mm) | 2nd formed bead outside diameter (mm) | 3rd formed bead outside diameter (mm) | 4th formed bead outside diameter (mm) | 5th formed bead outside diameter (mm) |
|---|---|---|---|---|---|---|---|---|
| 115 | Invention example | 4 circles | 1 | 4 | 6 | 8 | 10 | — |
| 116 | Comparative example | 3 circles | 1 | 10 | 6 | 8 | — | — |
| 117 | Comparative example | 5 circles | 1 | 10 | 6 | 8 | 4 | 8 |

TABLE 7-continued

| No. | Time from end of formation of 1st bead to start of formation of 2nd bead (s) | Bead cracking | Tensile shear strength ratio | Remarks |
|---|---|---|---|---|
| 115 | According to present invention | None | 1 | |
| 116 | According to PLT 2* | None | 0.75 | |
| 117 | According to PLT 2* | None | 0.9 | Reduction in thickness of weld metal in sheet thickness direction due to spatter |

*PLT 2 . . . Japanese Patent Publication No. 2012-240086A

INDUSTRIAL APPLICABILITY

According to the present invention, a laser welded joint more excellent in joint strength than the past is obtained and can be applied to members for automobiles and members for other vehicles, members for household electrical appliances, building materials, ships, etc., so the industrial applicability is great.

REFERENCE SIGNS LIST 1. laser welded joint
5. metal sheets
10. first weld bead
20. second weld bead
30. third weld bead
40. discontinuous part of bead
50. hat-shaped member
50a. flange part of hat-shaped member
51. weld bead
60. first weld bead in prior art
61. second weld bead in prior art

The invention claimed is:

1. A laser welded joint obtained by welding a plurality of overlaid steel sheets with a C content of 0.65% or less, a thickness of the steel sheets being 0.5 to 3.0 mm, the laser welded joint comprising
    triple or more ring-shaped or open ring-shaped weld beads in a concentric manner,
    wherein surface hardnesses of the weld beads become higher the further to an outside,
    a width of the weld beads is 0.5 to 1.5 mm, and
    a diameter of the outermost side weld bead is 20 mm or less.

2. A laser welding method overlaying a plurality of steel sheets with a C content of 0.65% or less, a thickness of the steel sheets being 0.5 to 3.0 mm, and forming multiple ring-shaped or open ring-shaped weld beads to weld together the overlaid steel sheets by laser irradiation, in such a way that a width of the weld beads is 0.5 to 1.5 mm, and a diameter of the outermost side weld bead is 20 mm or less, the method comprising the steps of
    forming a ring-shaped or open ring-shaped first weld bead by laser irradiation and
    successively forming a further two or more ring-shaped or open ring-shaped weld beads in the order from an innermost toward an outermost at the outside of the first weld bead by laser irradiation.

3. The laser welding method according to claim 2, wherein an outside weld bead is formed after the elapse of 0.5 sec or more from the finish time of forming an inside weld bead.

4. The laser welding method according to claim 2, wherein the second and later weld beads start to be formed after a temperature of the inside weld bead becomes martensite transformation starting temperature −50° C. or less.

5. The laser welding method according to claim 2, wherein both the first weld bead and the two or more ring-shaped or open ring-shaped weld beads formed at the outside of the first weld bead are formed so as not to be overlaid.

6. The laser welding method according to claim 2, wherein the weld bead formed at, an outermost side is formed so as to partially overlap the inside weld bead.

7. The laser welding method according to claim 2, wherein the weld beads are formed by remote laser welding.

8. The laser welding method according to claim 3, wherein the second and later weld beads start to be formed after a temperature of the inside weld bead becomes martensite transformation starting temperature −50° C. or less.

9. The laser welding method according to claim 3, wherein both the first weld bead and the weld bead formed at the outside thereof are formed so as not to be overlaid.

10. The laser welding method according to claim 4, wherein both the first weld bead and the weld bead formed at the outside thereof are formed so as not to be overlaid.

11. The laser welding method according to claim 3, wherein the weld bead formed at the outermost side is formed so as to partially overlap the inside weld bead.

12. The laser welding method according to claim 4, wherein the weld bead formed at the outermost side is formed so as to partially overlap the inside weld bead.

13. The laser welding method according to claim 3, wherein the weld beads are formed by remote laser welding.

14. The laser welding method according to claim 4, wherein the weld beads are formed by remote laser welding.

15. The laser welding method according to claim 5, wherein the weld beads are formed by remote laser welding.

16. The laser welding method according to claim 6, wherein the weld beads are formed by remote laser welding.

* * * * *